United States Patent [19]
Freed

[11] Patent Number: 6,009,318
[45] Date of Patent: Dec. 28, 1999

[54] ELECTRONICALLY ADJUSTABLE BALANCED-TO-UNBALANCED CONVERTERS (BALUN)

[75] Inventor: John G. Freed, Raleigh, N.C.

[73] Assignee: Ericsson Inc., Research Triangle Park, N.C.

[21] Appl. No.: 08/899,263

[22] Filed: Jul. 23, 1997

[51] Int. Cl.⁶ ...................................................... H04B 1/26
[52] U.S. Cl. ........................................... 455/326; 455/323
[58] Field of Search .................................... 455/323, 326, 455/179.1, 188.2, 193.3; 327/113

[56] References Cited

U.S. PATENT DOCUMENTS

| | | | |
|---|---|---|---|
| 2,038,570 | 12/1936 | Keall | 327/113 |
| 2,063,248 | 4/1936 | Hansell | 327/113 |
| 3,400,333 | 9/1968 | Inose | 327/113 |
| 3,727,078 | 4/1973 | Wollesen | 327/113 |
| 4,048,598 | 9/1977 | Knight | 455/188.2 |
| 4,234,929 | 11/1980 | Riley, Jr. | 327/113 |
| 4,399,559 | 8/1983 | Theriault | 455/179.1 |
| 4,619,001 | 10/1986 | Kane | 455/326 |
| 4,760,325 | 7/1988 | Suzuki et al. | 455/323 |
| 4,921,465 | 5/1990 | Hietala et al. | 455/193.3 |
| 5,115,214 | 5/1992 | Gassmann et al. | 333/26 |
| 5,553,319 | 9/1996 | Tanbakuchi | 455/326 |

*Primary Examiner*—Reinhard J. Eisenzopf
*Assistant Examiner*—Duc Nguyen
*Attorney, Agent, or Firm*—Myers Bigel Sibley & Sajovec

[57] ABSTRACT

Electronically adjustable baluns and electronically adjustable balanced-to-unbalanced converting methods are provided. The electronically adjustable baluns are responsive to an electronic tuning signal to electronically vary the frequency range thereof. The baluns may include an electronically variable transformer, capacitor or inductor or switched transformers, inductors or capacitors, or combinations of these elements.

8 Claims, 7 Drawing Sheets

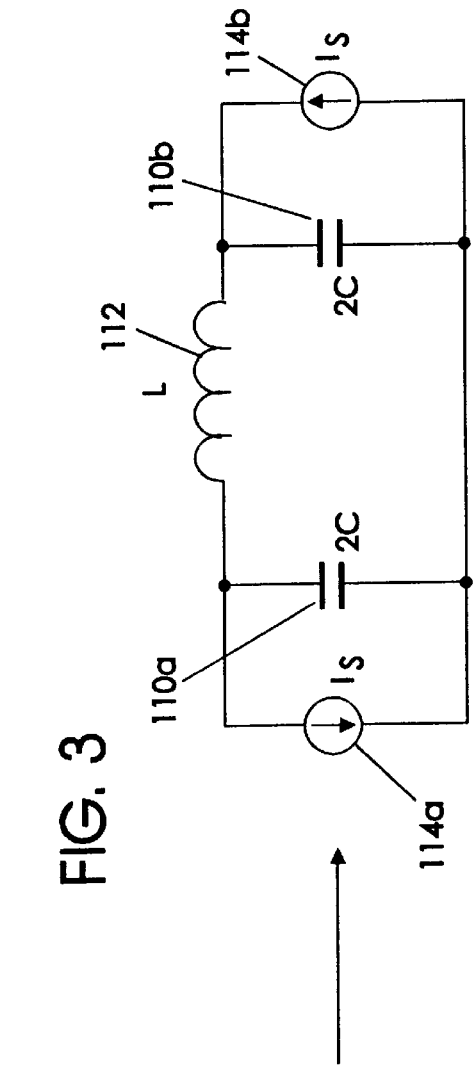
FIG. 3
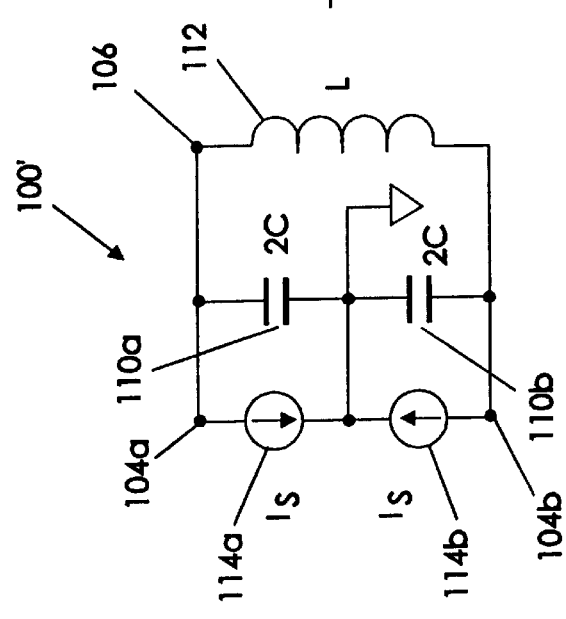
FIG. 4
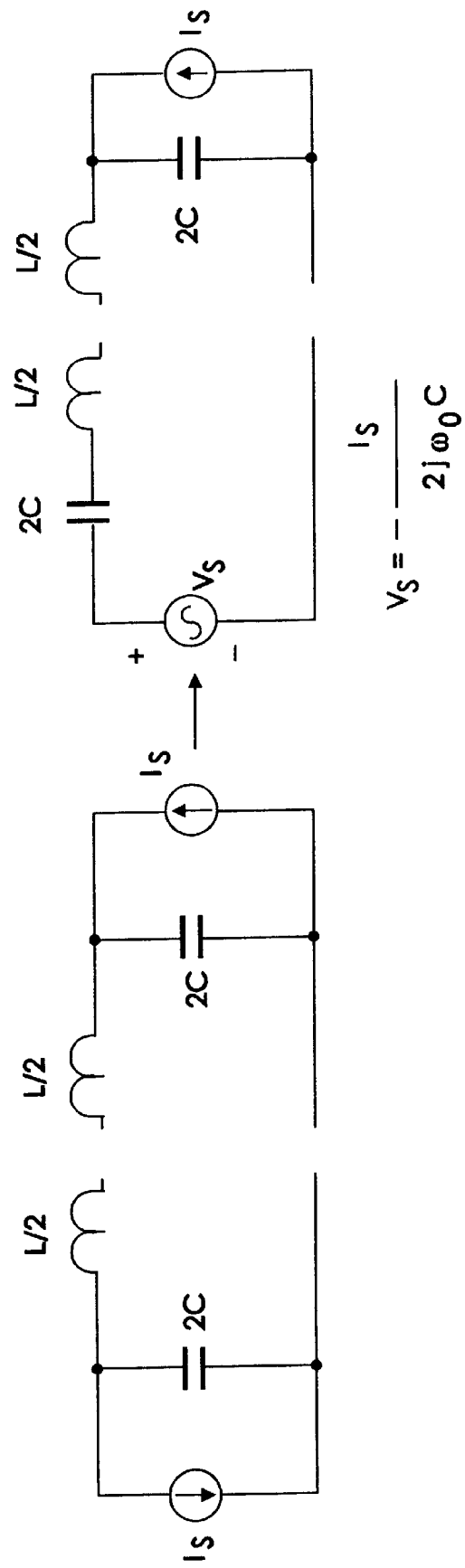

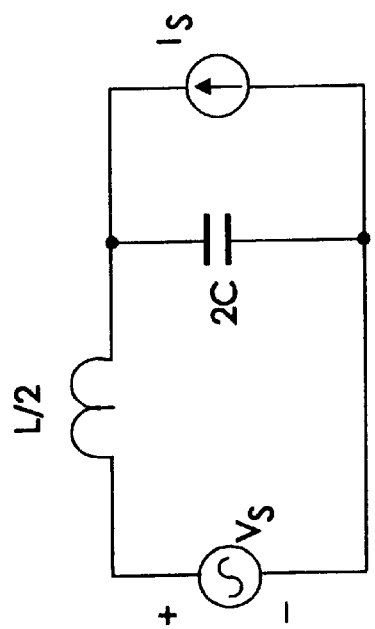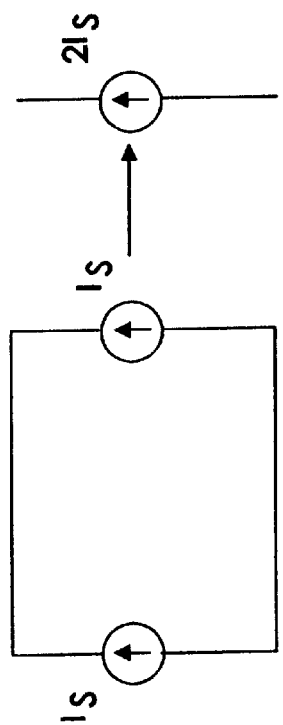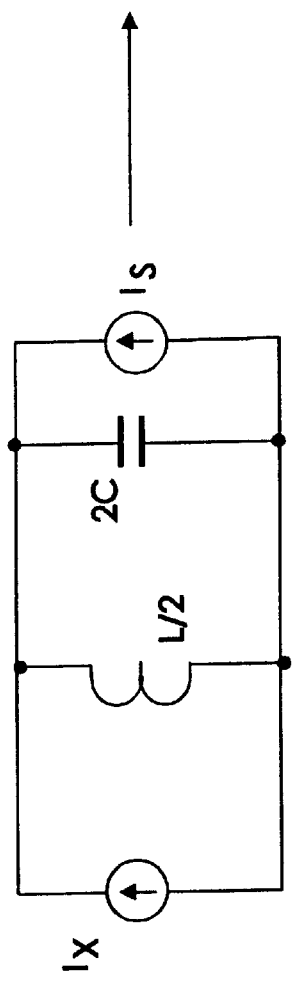
FIG. 5
FIG. 6

ELECTRONICALLY ADJUSTABLE BALANCED-TO-UNBALANCED CONVERTERS (BALUN)

FIELD OF THE INVENTION

This invention relates to electric circuits, and more particularly to balanced-to-unbalanced converters.

BACKGROUND OF THE INVENTION

Balanced-to-unbalanced converters, commonly to referred to as "balun"s, are widely used in electronic systems to convert balanced inputs to unbalanced outputs. For example, they may be used in radio communications equipment such as cellular telephones.

In particular, cellular telephones generally use mixers for frequency conversion. A typical radio transceiver included in a cellular telephone may include three mixers, two for the receiver and one for the transmitter. A dual band cellular telephone may include up to six or more mixers.

Because the mixer is a nonlinear device, it may generate signals at other than its desired output frequency. In order to reduce or suppress these signals, many mixers are designed for differential inputs and outputs. These mixers are known as "balanced mixers". When using such a balanced mixer, it is often desirable to convert the output of the balanced mixer into an unbalanced signal. This conversion is performed by a balun. The balun receives the output of the balanced mixer, i.e. a signal and its complement, which is a 180° phase shifted signal of the same amplitude. The balun combines these two signals, one at 0° phase and the other at the same amplitude, but with a 180° relative phase difference. The combination is performed by subtracting the balanced output signals to form a single unbalanced signal with twice the amplitude of either individual signal.

With increasing integration levels, balanced mixers are now generally available in integrated circuit form. These balanced mixers generally include an upper frequency limit within which the device should be used. Thus, a separate mixer is generally used for a particular function in each band. For example, a separate transmit mixer is generally used for each band in a dual band cellular telephone.

Separate mixers may be used in order to simultaneously provide a high impedance load at the mixer output and to combine the differential (balanced) outputs to a single ended (unbalanced) output. A high impedance is often desirable for balanced-to-unbalanced conversion, because the mixer's voltage gain is generally given by $A_V = g_c R_L$ where $A_V$ is the voltage gain of the mixer expressed as a ratio, $g_c$ is the conversion transconductance of the mixer active device, and $R_L$ is the load resistance of the mixer. If the two differential outputs of the mixer are considered as current sources, and the outputs are combined in phase by the balun, there is twice the current available, i.e. an increase in gain of 6dB. Moreover, by combining the two differential outputs, spurious responses that might otherwise degrade performance may be canceled.

FIG. 1 schematically illustrates a first embodiment of a conventional balun. As shown in FIG. 1, the balun 100 includes a balanced input including balanced input terminals 104a and 104b, and an unbalanced output 106. A balun circuit, such as an n:1 turns ratio transformer 108 is used to convert the balanced inputs 104a, 104b to an unbalanced output 106. As shown in FIG. 1, the balanced input 104a, 104b of balun 100 may be connected to the output of a mixer 102. Impedance transformation is also provided. For example, if the load resistance of the mixer 102 is $R_L$ and the output resistance of the balun is $R_O$, then the impedance is transformed according to the formula $R_O = R_L/n^2$, where n is the turns ratio of transformer 108.

It will be understood that one or more additional components may be used in the balun of FIG. 1 to cancel reactive components of the impedance at the mixer output. It will also be understood that the transformer implementation of a balun as shown in FIG. 1 may be difficult to implement because the impedance transforming ratio is directly dependent on the turns ratio, which may often lead to custom transformers and relatively high cost. Moreover, the transformer may be large and there may be an inverse relationship between impedance ratio and operational bandwidth.

FIGS. 2A and 2B illustrate second embodiments of a conventional balun. In FIGS. 2A and 2B, three element baluns are shown, including two capacitors 110a and 110b and an inductor 112. The balun 100' of FIG. 2A uses two discrete capacitors 110a and 110b and an inductor 112. In the balun 110" of FIG. 2B, the second capacitor 110b is implemented as a third and fourth capacitor 110c and 110d, which are serially connected to provide an unbalanced output 106' of lower impedance therebetween. The balun 100' of FIG. 2A provides balanced-to-unbalanced conversion. The balun 110" of FIG. 2B provides balanced-to-unbalanced conversion and simultaneous impedance transformation to provide a low impedance output 106'.

SUMMARY OF THE INVENTION

The present invention includes electronically adjustable baluns and electronically adjustable balanced-to-unbalanced converting methods. By using electronic adjustment, a single balun may be used in multiple bands and for multiple functions. High performance baluns may thereby be provided with the ability to save cost, parts count and/or circuit board real estate. It will be understood that the electronically adjustable balun may include any adjustment by electromagnetic wave signals, including but not limited to electrical, optical or radio frequency signals.

In particular, balanced-to-unbalanced converters (balun) according to the invention, include a balanced input, an unbalanced output and a balun circuit which converts balanced signals in a predetermined frequency range on the balanced input to unbalanced signals on the unbalanced output. The balun circuit is responsive to an electronic tuning signal, to electronically vary the predetermined frequency range. The balun circuit may include an electronically variable transformer. The balun circuit may also include at least one variable capacitor or variable inductor, which is responsive to an electronic tuning signal to electronically vary the predetermined frequency range. The balun circuit may also include at least one capacitor or inductor and a switch that switches the at least one capacitor or inductor into or out of the balun circuit in response to the electronic tuning signal, to thereby electronically vary the predetermined frequency range.

In another embodiment of the present invention, a variable capacitor or variable inductor may be combined with a switchable capacitor or switchable inductor, to provide coarse tuning and fine tuning of the balun. In particular, the electronic tuning signal may include a first and second electronic tuning signal. A switch is responsive to the first electronic signal to switch the at least one capacitor or inductor out of the balun circuit, to thereby electronically vary the predetermined frequency range by a first increment. The at least one variable capacitor or variable inductor is responsive to the second electronic tuning signal, to electronically vary the predetermined frequency range by a second increment which is less than the first increment.

Baluns according to the invention may be used in combination with a mixer. The mixer includes a local oscillator and a controller which controls the oscillator frequency of the local oscillator. The controller, such as a microprocessor controller, can also be used to generate the electronic tuning signal, to thereby electronically vary the predetermined frequency range to include the local oscillator frequency. The balun may be used in combination with a mixer in a radiotelephone system, to thereby provide a multiband radiotelephone. The balun circuit may also be used to transform impedance between the balanced input and the unbalanced output.

Balanced-to-unbalanced converting methods according to the invention include the step of electronically varying a predetermined frequency range of a balun circuit in response to an electronic tuning signal, to thereby convert balanced signals in the predetermined frequency range to unbalanced signals. Balanced-to-unbalanced converting methods may use variable capacitors and/or inductors, switched capacitors and/or inductors, and combinations thereof, as was described above. Electronically adjustable wide-range baluns and balanced-to-unbalanced converting methods are thereby provided.

BRIEF DESCRIPTION OF THE DRAWINGS

FIGS. 3–6 schematically illustrate circuits which analyze the operation of the conventional balun of FIG. 2A.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
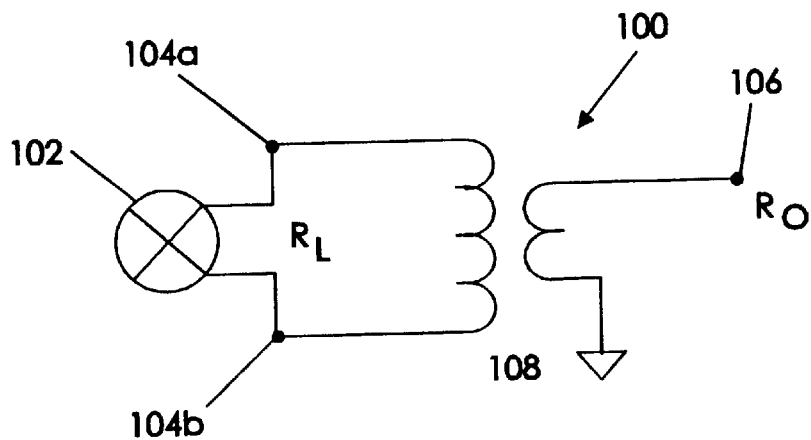
FIGS. 1, 2A and 2B schematically illustrate embodiments of conventional baluns.
Figure 2A:
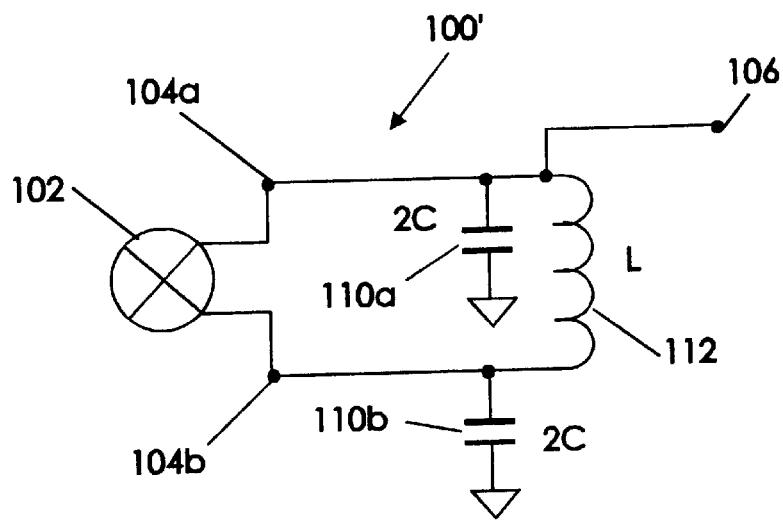
Figure 2B:
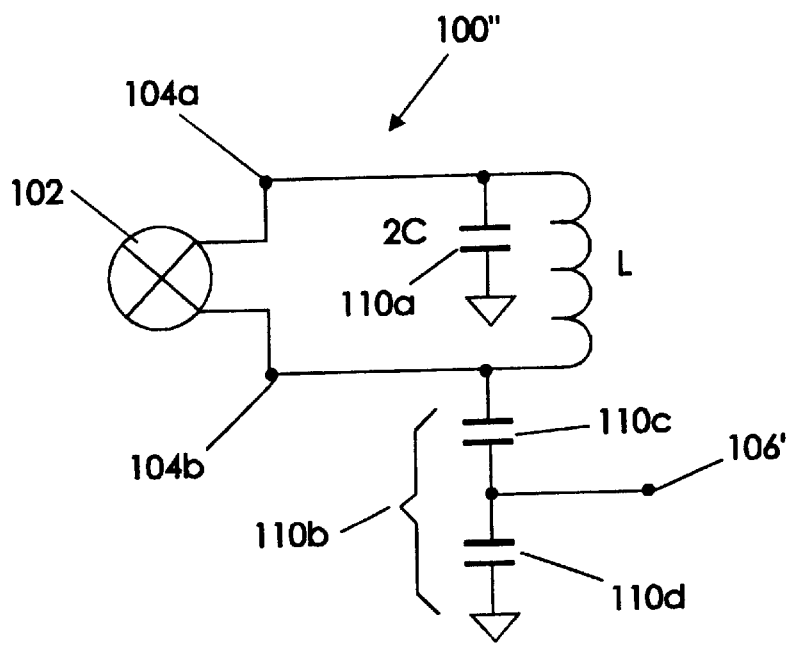

The present invention stems, in part, from the realization that a balun is an example of a tuned circuit. The invention also stems in part from the realization that the balun can therefore be electronically tuned using an electronic tuning signal, to thereby electronically vary the frequency range thereof, and thereby allow improved performance and cost savings. Accordingly, without limiting the scope of the present invention, a circuit analysis of the operation of the conventional balun of FIG. 2A will now be presented.

In FIG. 3, the outputs of mixer 102 are replaced by current sources 114a, 114b of magnitudes $I_s$ and of opposite instantaneous directions. The circuit of FIG. 3 is bisected and the left hand side current source 114a is converted to a voltage source to produce the circuits of FIG. 4.

Since $\omega_0^2 = 1/LC$, the series branch is resonant and the circuit simplifies to the circuit of FIG. 5. Converting the voltage source of FIG. 5 back to a current source, the circuit of FIG. 6 is obtained, where $$I_X = \frac{V_S}{j\omega_0 \frac{L}{2}} = \frac{\frac{-I_S}{j\omega_0 2C}}{j\omega_0 \frac{L}{2}}$$

$$I_X = \frac{-I_S}{-\omega_0^2 LC} = I_S \text{ since } \omega_0^2 = \frac{1}{LC}$$

Thus, the differential current sources have been converted to a single-ended source of twice the magnitude.

It will be understood that, in the analysis described above, resonance of the circuit was assumed. If the circuit is not resonant, then the two current vectors will generally differ in magnitude and phase. Thus, the single-ended output current will generally be less than twice the individual source currents, with the value decreasing the further away from resonance the circuit operates. For a high Q network, which will generally be the case when presenting a high impedance to the mixer output, this decrease can be quite rapid.

Figure 7:
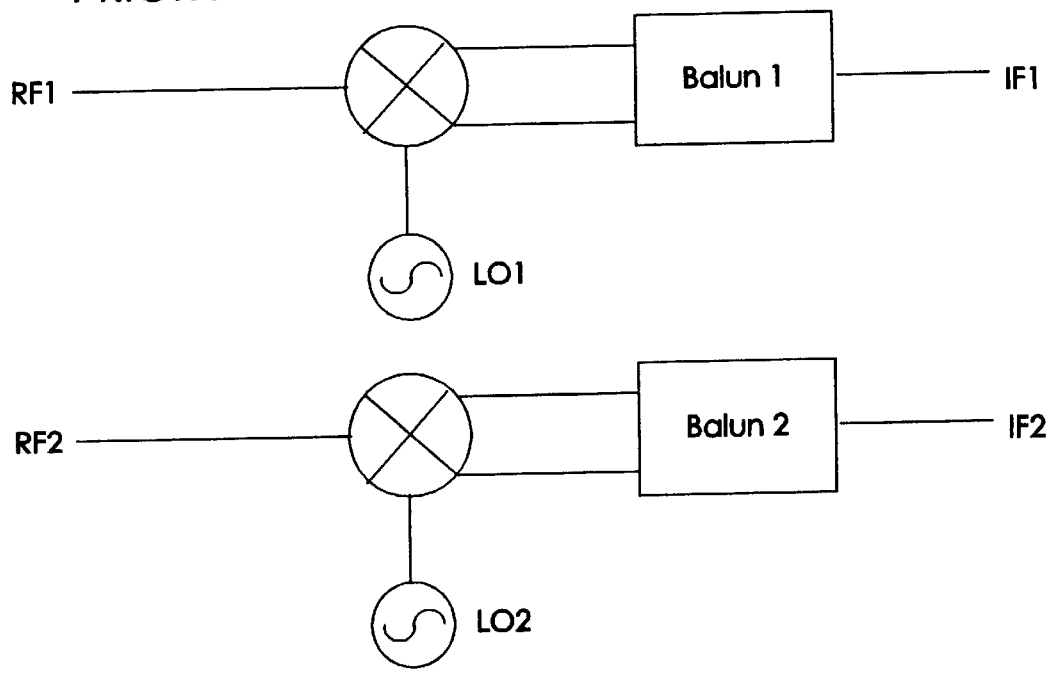
FIG. 7 schematically illustrates a conventional dual-band circuit using a mixer and balun for each band.

Accordingly, the balun will generally operate properly over a limited bandwidth. Thus, due to the narrow band characteristics of the three-element balun, cellular telephones and other dual-band circuits generally use a mixer and balun for each band, as shown in FIG. 7. It will be understood that each of the paths of FIG. 7 can be either a receive path or a transmit path. Unfortunately, as shown, separate mixers, local oscillators and baluns are generally used for each function. Thus, in a dual-band cellular/PCS radiotelephone, a separate transmit subsystem for the cellular band and the PCS band is generally used. This may require more space within the phone and more components than if a single system could be used.

The present invention allows a balun to be used at more than one frequency range by incorporating an electronic tuning control to resonate the balun at each different range. Electronic tuning can be accomplished using many techniques. For example, the balun resonance can be adjusted by electronically varying the circuit capacitance using a voltage variable capacitance diode (varactor). Alternatively, the circuit resonance can be adjusted by switching a fixed value of capacitance in or out of the circuit. Alternatively, the inductance can be electronically controlled by switching a fixed value of inductance in or out of the circuit or by electronically varying the circuit inductance such as by modifying inductor permeability with a DC bias current.

Figure 8:
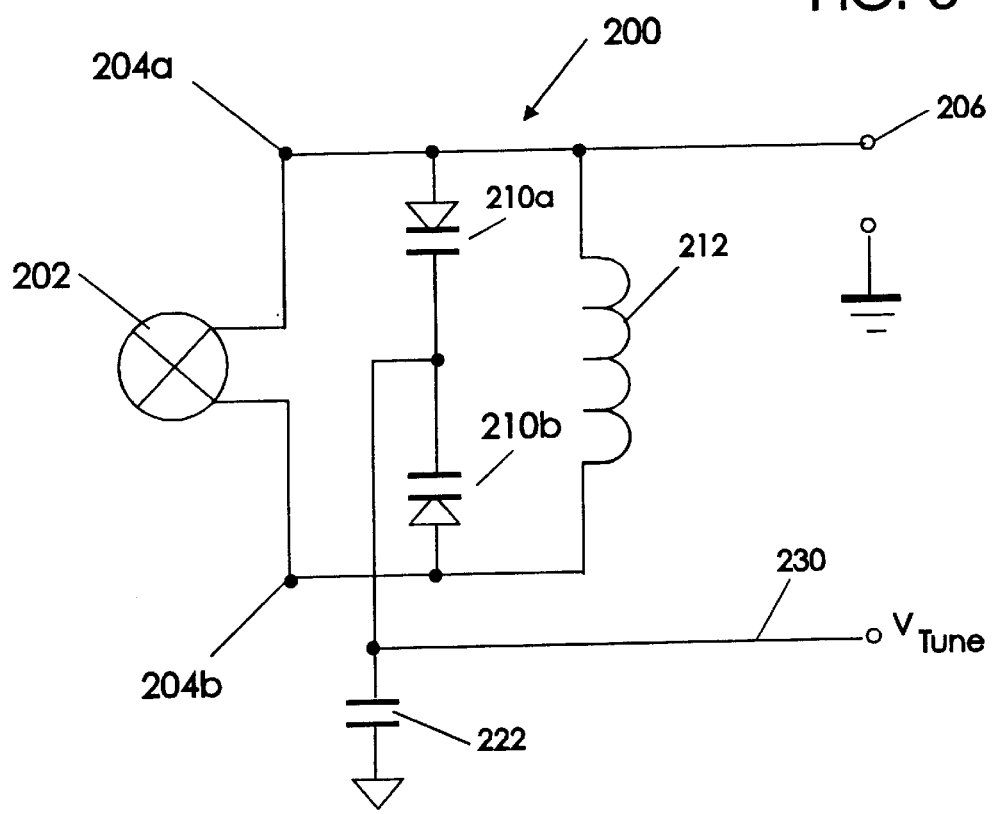
FIG. 8 schematically illustrates a first embodiment of baluns according to the present invention.

FIG. 8 schematically illustrates a first embodiment of the present invention. As shown in FIG. 8, a balun 200 includes a balanced input including balanced input terminals 204a and 204b, and an unbalanced output 206. The balun includes an inductor 212. A pair of variable capacitors, such as varactors 210a and 210b, are serially connected in parallel with the inductor 212. An electronic tuning signal designated $V_{Tune}$ is applied to electronic tuning port 230 to electronically tune the variable capacitors 210a and 210b. A decoupling capacitor 222 is also included. As also shown in FIG. 8, the output of a mixer 202 is connected to the balanced input terminals 204a, 204b.

Figure 9:
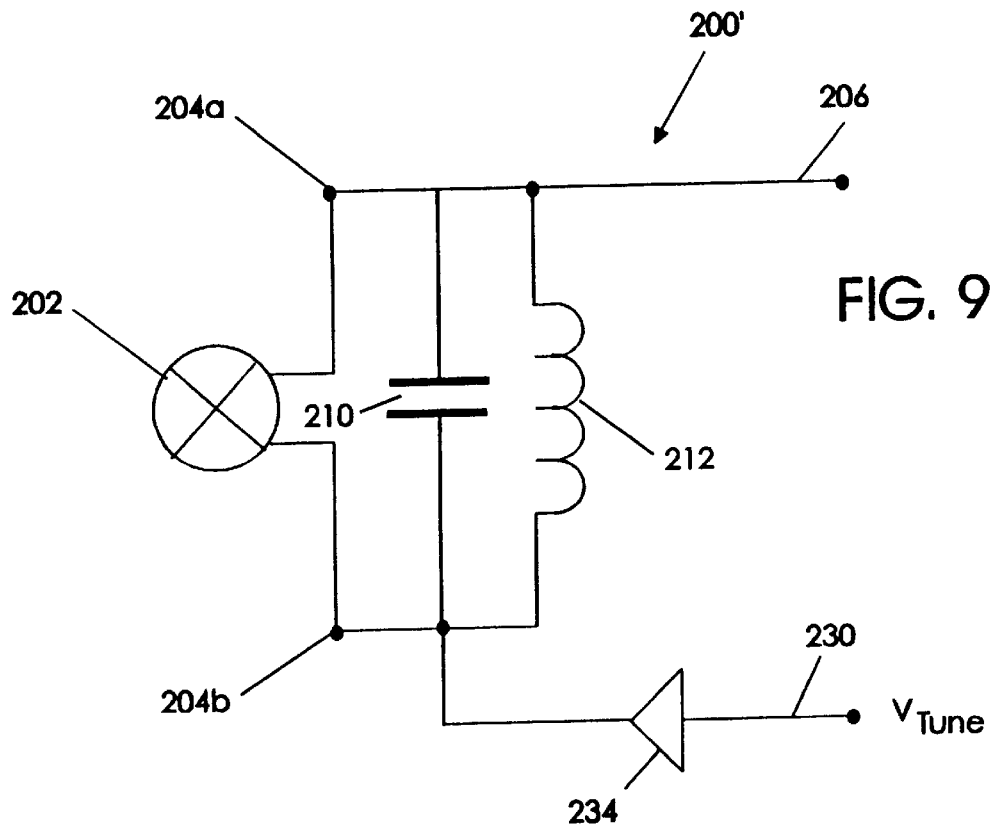
FIG. 9 schematically illustrates a second embodiment of baluns according to the present invention.

FIG. 9 illustrates a second embodiment of baluns according to the present invention. In this embodiment, a fixed capacitor 210 is used, and the permeability of inductor 212 in balun 200' is modified by supplying a DC bias current to inductor 212 using amplifier 234, which is responsive to electronic tuning signal $V_{Tune}$ at tuning port 230. It will also be understood that combinations of FIGS. 8 and 9 may be implemented using a single electronic tuning signal $V_{Tune}$. Alternatively, the electronic tuning signal may include a first electronic tuning signal which is applied to the capacitors or varactors 210a, 210b and a second electronic tuning signal which is applied to the amplifier 232.

Figure 10:
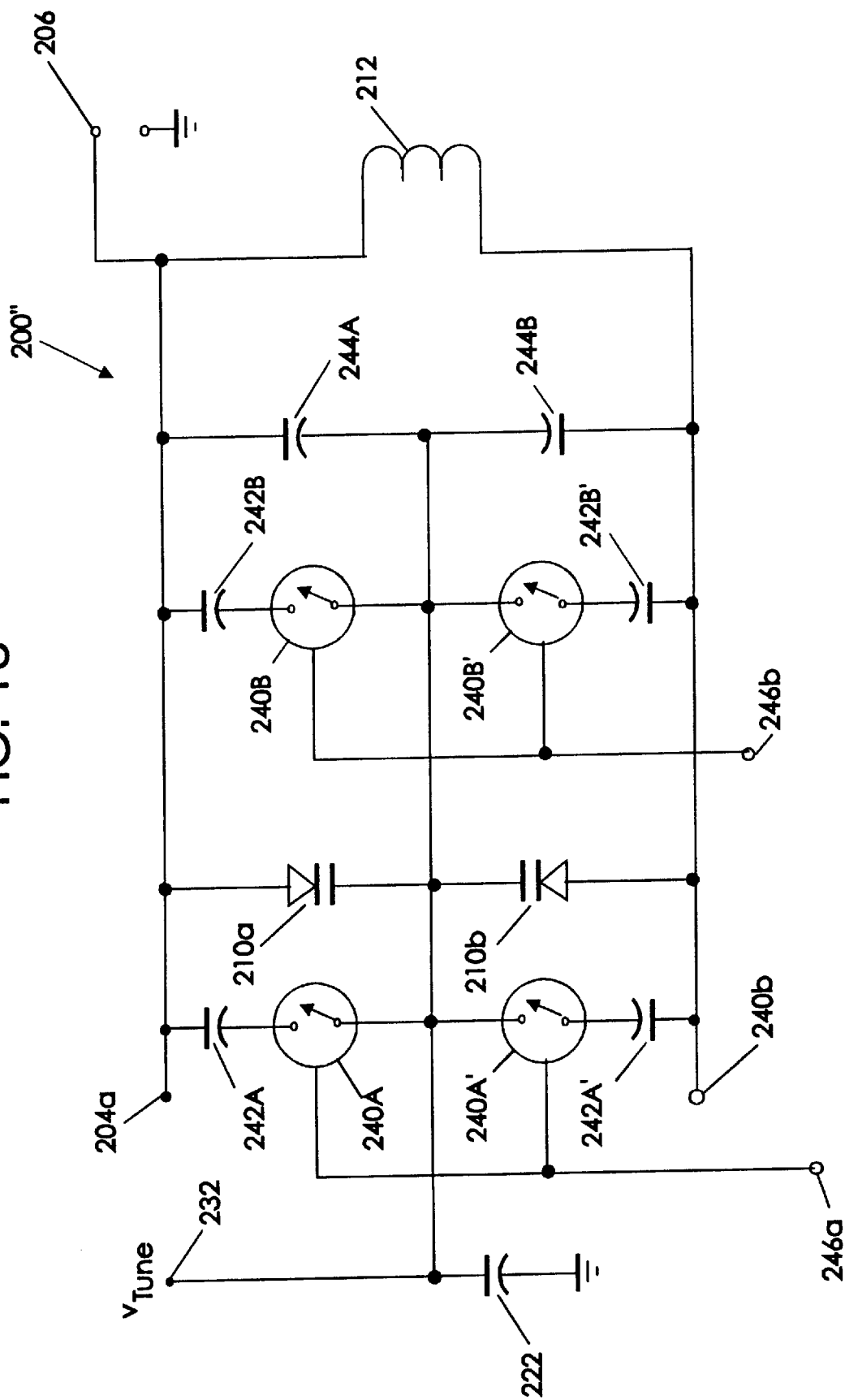
FIG. 10 schematically illustrates a third embodiment of baluns according to the present invention.

FIG. 10 illustrates yet another embodiment of baluns 200'' of the present invention, where four switches 240A, 240A', 240B and 240B' are used to switch in and out associated capacitors 242A, 242A', 242B and 242B'. Optional fixed capacitors 244A and 244B may also be included.

The embodiment shown in FIG. 10 may be used to provide four different bands using switches 240A, 240B, 242A' and 242B', as shown in the following Table.

TABLE

| SWITCH | 242A, 242A' | 242B, 242B' |
|---|---|---|
| BAND 1 | OPEN | CLOSED |
| BAND 2 | CLOSED | OPEN |
| BAND 3 | CLOSED | CLOSED |
| BAND 4 | OPEN | OPEN |

For purposes of this Table, it is assumed that switches 242A and 242A' operate together and switches 242B and 242B' operate together. It will be understood that capacitors 242B, 242B', 244A and 244B need not be included. It will also be understood that the switches 240A, 240A', 240B, 240B' may be implemented as PIN diodes, transistors or other electronic switches or electromechanical devices, which are responsive to electronic signals 246a and 246b.

Still referring to FIG. 10, a pair of varactor diodes 210a and 210b are also included. These varactor diodes are responsive to another electronic tuning signal $V_{Tune}$ at tuning port 232. Thus, the switched capacitors may be used for coarse tuning and the varactors may be used for fine tuning. It will also be understood that the varactors may replace one or more sets of switched capacitors. The electronic tuning signals 246a, 246b and 232 may be generated under microprocessor control. Fine tuning can be used to further extend the operating range of the balun and/or to reduce its sensitivity to electrical noise at the tuning port.

It will be understood that analogous embodiments may be formed using inductors. For example, inductors may be switched in or out or taps on an inductor may be shorted by switches under external control. The value of the inductor permeability may be electronically changed if the inductor is wound on a magnetic core. Switched and variable inductors may also be used in combination. Balun circuits which combine adjustable capacitors and inductors may also be used.

Figure 11:
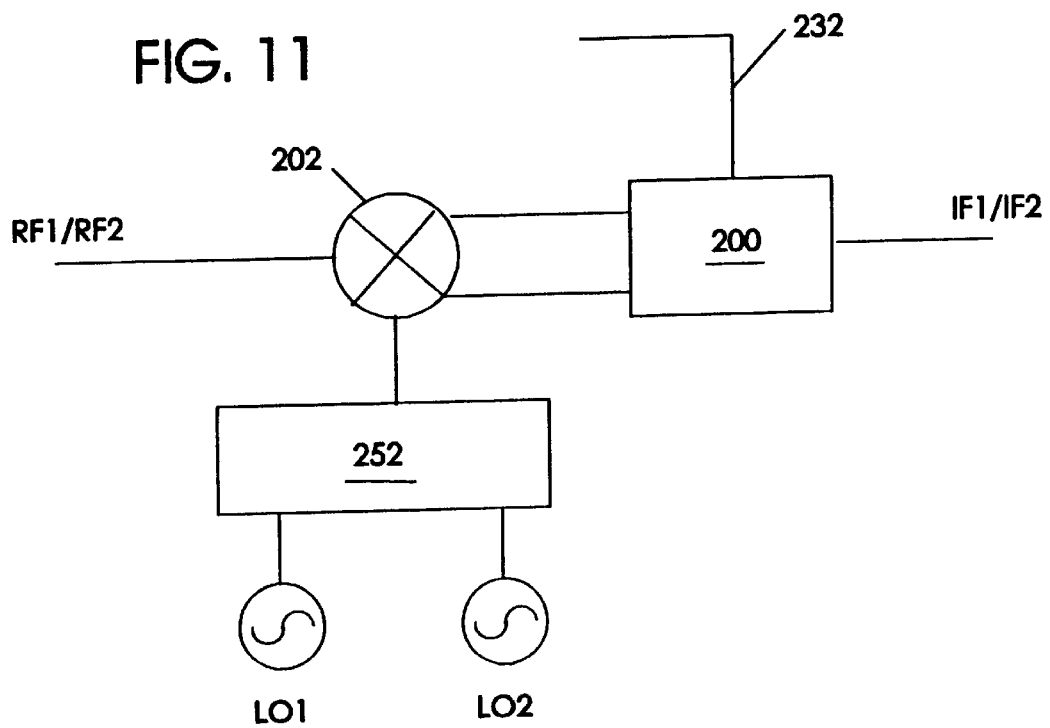
FIG. 11 is a block diagram which schematically illustrates a balun circuit according to the present invention used in a dual band operation, such as in a cellular telephone.

FIG. 11 illustrates a balun circuit used in a dual band application such as a cellular telephone. As shown in FIG. 11, a balun 200 may be used in connection with a pair of local oscillators LO1 and LO2 and a switch or combining network 252. Two RF frequencies RF1 and RF2 may be used with a mixer 202, and the electronic tuning signal or port 232 or combinations of electronic tuning signals as described above may be used.

It will be understood that the mixer may be a transmit or receive mixer, which uses an electronically adjustable balun to allow a single device to perform a function that previously used two devices. Because the RF and LO port impedances may be significantly lower than the IF output port, wide band matching networks can be synthesized to interface to these ports such that when used with the electronically tuned balun, a wide band mixer results.

Figure 12:
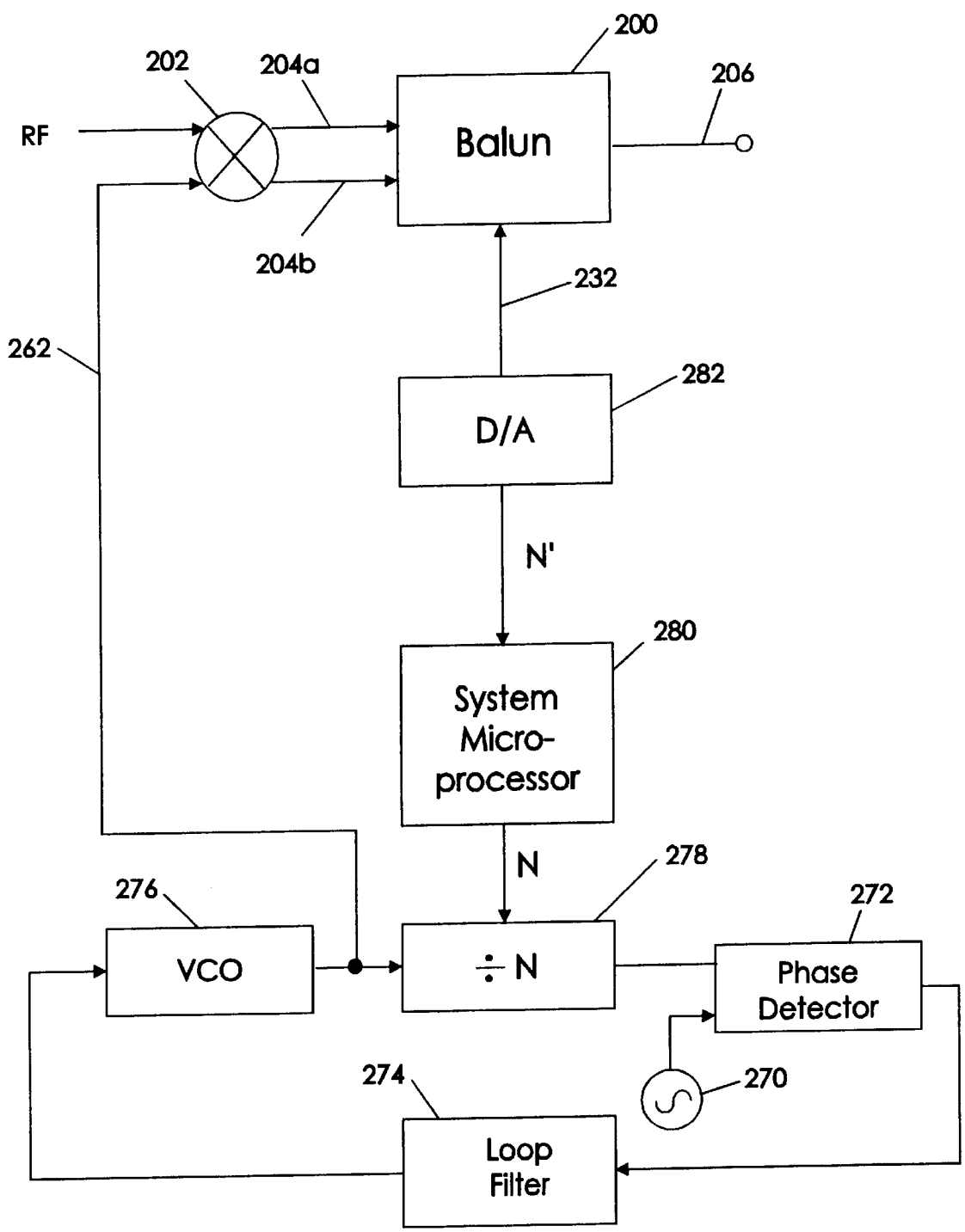
FIG. 12 illustrates a block diagram of baluns according to the invention combined with a mixer having a synthesized local oscillator under common microprocessor control.

FIG. 12 illustrates baluns according to the invention combined with a mixer having a synthesized local oscillator under common microprocessor control. As shown in FIG. 12, balun 200 is combined with mixer 202. The local oscillator signal 262 is generated by a synthesized local oscillator including a reference oscillator 270, a phase detector 272, a loop filter 274, a voltage controlled oscillator (VCO) 276, and a divide by N circuit 278. Operation of these components to generate a synthesized local oscillator are well known to those having skill in the art and need not be described further herein.

A system controller, such as a system microprocessor 280 is used to generate a value N, which is applied to the divide by N circuit 278, to generate the synthesized local oscillator signal 262. A value N' is also generated by the system microprocessor 280 and applied to a digital-to-analog converter (D/A) 282, to produce electronic tuning signal 232.

Thus, the microprocessor that tunes the synthesizer by selecting the numerical value N for its divide by N feedback device, also outputs a second digital value N' which is a function of the numerical value of N. The value of N' is preferably chosen so that its conversion to an analog voltage by the analog-to-digital converter tunes the balun to a frequency which is appropriate for the intended mixing process. The balun thereby can track the local oscillator frequency changes.

The RF signals of FIGS. 11 and 12 may be cellular telephone signals, so that the signal provided at the unbalanced output may be a frequency converter cellular telephone signal. The remainder of the cellular telephone need not be illustrated because it is well known to those having skill in the art. See, for example, U.S. Pat. No. 5,515,432 to Rasmussen, assigned to the assignee of the present invention, the disclosure of which is hereby incorporated herein by reference.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A balanced to unbalanced converter (balun) comprising:

a balanced input;

an unbalanced output;

a balun circuit which converts balanced signals in a predetermined frequency range on the balanced input to unbalanced signals on the unbalanced output, wherein the balun circuit is responsive to an electronic tuning signal to electronically vary the predetermined frequency range;

wherein the balun circuit comprises at least one capacitor or inductor and a switch that switches the at least one capacitor or inductor in or out of the balun circuit in response to the electronic tuning signal to electronically vary the predetermined frequency range;

wherein the balun circuit further comprises at least one variable capacitor or variable inductor which is responsive to the electronic tuning signal to electronically vary the predetermined frequency range; and wherein the electronic tuning signal comprises a first and a second electronic tuning signal, the switch being responsive to the first electronic tuning signal to switch the at least one capacitor or inductor in or out of the balun circuit to electronically vary the predetermined frequency range by a first increment, and the at least one variable capacitor or variable inductor being responsive to the second electronic tuning signal to electronically vary the predetermined frequency range by a second increment which is less than the first increment.

2. A balun according to claim 1 in combination with a mixer, the mixer comprising a local oscillator and a controller which controls the oscillator frequency of the local oscillator, the controller further generating the first and second electronic tuning signals to thereby electronically vary the predetermined frequency range to include the local oscillator frequency.

3. A balun according to claim 2 in further combination with a radiotelephone system to thereby provide a multiband radiotelephone.

4. A balun according to claim 1 wherein the balun circuit further transforms impedance between the balanced input and the unbalanced output.

5. A balanced to unbalanced converter (balun) comprising:

a balanced input;

an unbalanced output; and means for converting balanced signals of a predetermined frequency range at the balanced input to unbalanced signals at the unbalanced output and for electronically varying the predetermined frequency range in response to an electronic tuning signal;

wherein the converting and electronically varying means comprises at least one capacitor or inductor and means for switching the at least one capacitor or inductor in or out of the balun in response to the electronic tuning signal to electronically vary the predetermined frequency range;

wherein the converting and electronically varying means further comprises at least one variable capacitor or variable inductor which is responsive to the electronic tuning signal to electronically vary the predetermined frequency range; and wherein the electronic tuning signal comprises a first and a second electronic tuning signal, the switching means being responsive to the first electronic tuning signal for switching the at least one capacitor or inductor in or out of the balun to electronically vary the predetermined frequency range by a first increment, and the at least one variable capacitor or variable inductor being responsive to the second electronic tuning signal to electronically vary the predetermined frequency range by a second increment which is less than the first increment.

6. A balun according to claim 5 in combination with mixing means comprising a local oscillator and means for controlling the oscillator frequency of the local oscillator, the controlling means further comprising means for generating the first and second electronic tuning signals to thereby electronically vary the predetermined frequency range to include the local oscillator frequency.

7. A balun according to claim 6 in further combination with a radiotelephone system to thereby provide a multiband radiotelephone.

8. A balun according to claim 5 wherein the converting and electronically varying means further comprises means for transforming impedance between the balanced input and the unbalanced output.

* * * * *